United States Patent [19]  
Kusano et al.

[11] Patent Number: 4,979,009  
[45] Date of Patent: Dec. 18, 1990

[54] HETEROJUNCTION BIPOLAR TRANSISTOR

[75] Inventors: Chushiro Kusano, Tokorozawa; Tomonori Tanoue, Ebina; Katsuhiko Mitani, Kokubunji, all of Japan

[73] Assignee: Hitachi, Ltd., Tokyo, Japan

[21] Appl. No.: 415,708

[22] Filed: Sep. 29, 1989

Related U.S. Application Data

[63] Continuation of Ser. No. 203,458, Jun. 7, 1988, abandoned.

[30] Foreign Application Priority Data

Jun. 8, 1987 [JP] Japan .................. 62-141465

[51] Int. Cl.⁵ .................. H01L 29/261; H01L 29/72; H01L 27/12; H01L 29/205
[52] U.S. Cl. .................. 357/34; 357/4; 357/16
[58] Field of Search .................. 357/16, 34, 4

[56] References Cited

U.S. PATENT DOCUMENTS 4,811,070  3/1989  Hayashi et al. .................. 357/34

FOREIGN PATENT DOCUMENTS 0132025   1/1985  European Pat. Off. .............. 357/34
59-106154 of 1984 Japan .................. 357/34
60-242671 12/1985 Japan .................. 357/34
61-22936  10/1986 Japan .................. 357/34
62-33462   2/1987 Japan .................. 357/34

Primary Examiner—J. Carroll  
Attorney, Agent, or Firm—Antonelli, Terry, Stout & Kraus

[57] ABSTRACT

A heterojunction bipolar transistor is disclosed in which a region of a base layer which extends in the vicinity of the interface between the base layer and an emitter layer is doped with an impurity at a higher concentration than that in the inside of the base layer to thereby form a built-in field by which carriers injected from the emitter are caused to drift to the inside of the base layer. In the transistor having this structure, the current gain does not depend on the emitter area, and it is possible to obtain a large current gain with a small emitter area.

7 Claims, 2 Drawing Sheets

HETEROJUNCTION BIPOLAR TRANSISTOR

This is a continuation of application Ser. No. 07/203,458, filed June 7, 1988 abandoned.

BACKGROUND OF THE INVENTION

The present invention relates to a bipolar transistor that employs a heterojunction as an emitter-base junction, and is concerned with semiconductor devices whose current gain is high and independent of the emitter area and which exhibit high-speed characteristics.

Conventional heterojunction bipolar transistors suffer from the problem that the current gain is strongly dependent on the emitter area and, as the area decreases, the gain lowers by a large margin. This problem is considered attributable to the surface recombination of carriers injected into the base that takes place at the periphery of the emitter-base junction. In order to overcome the above-described problem, it has heretofore been conventional practice to change gradually the Al fraction in the base layer from the emitter toward the collector so as to slope the energy band gap and thereby form a built-in field as in the case of the GaAlAs-GaAs heterojunction transistor disclosed in Japanese Patent Laid-Open No. 61-201466 (1986) by way of example.

The above-described prior art enables an improvement in the emitter area dependency but still suffers from the problem that the fraction must be accurately controlled when the base layer is produced and this may hinder the achievement of high reproducibility and productivity.

SUMMARY OF THE INVENTION

It is an object of the present invention to provide a transistor structure by which it is possible to readily improve the emitter area dependency of the current gain which is attributable to the surface recombination that takes place in the vicinity of the emitter-base junction in a heterojunction bipolar transistor.

It is another object of the present invention to increase the base-collector breakdown voltage.

The first object is attained by highly doping the base layer at a region thereof which extends in the vicinity of the interface between the base and emitter layers. The object to achieve high breakdown voltage is attained by highly doping the base layer at a region thereof which extends in the vicinity of the interface between the base and collector layers.

In a heterojunction bipolar transistor having a uniform doping level and energy band gap, carriers which are injected into the base layer from the emitter layer are caused to move toward the collector and the extrinsic base region by diffusion. At this time, carriers which are present at the periphery of the emitter-base junction are, as is well known, susceptible to the effect of surface recombination. Accordingly, in the base current, the recombination current component is dominant over the diffusion current component, so that the current gain depends on the current level to a substantial extent and is also strongly dependent on the emitter area, which gives rise to a problem in practical application.

To overcome the above-described problem, in one form of the present invention, the base layer is highly doped only at regions thereof which extend in the vicinities of the interfaces between the base layer on the one hand and the emitter and collector layers on the other, and the intermediate region of the base layer which extends between the two heavily doped region is lightly doped, thereby forming a built-in field in the base layer. Since the built-in field functions so as to cause carriers injected from the emitter to drift to the inside of the base layer, it is possible to reduce the effect of the surface recombination. As a result, the emitter area dependency of the current gain is improved and it becomes possible to obtain a large current gain with a small area.

As to the region of the base layer which extends in the vicinity of the interface between the base and collector layers, it is possible to prevent the depletion layer from extending into the base layer even when a reverse bias voltage is applied between the collector and the base, and therefore it is possible to maintain high-breakdown voltage characteristics.

Even if the highly doped region is restricted within narrow limits, since the resistance of the whole of the base layer can be maintained at a low level by controlling the doping concentration, there is no fear of the high-speed characteristics of the device being impaired.

DETAILED DESCRIPTION OF THE PREFERRED EMBODIMENTS

Preferred embodiments of the present invention will be described hereinunder. Embodiment 1

Figure 1:
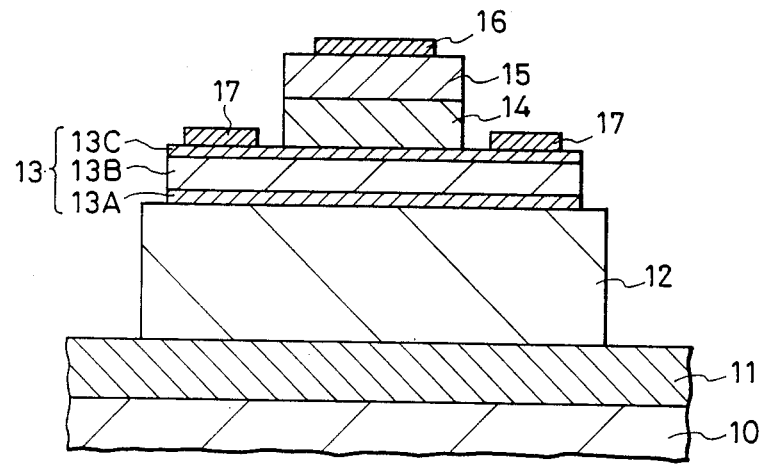
FIG. 1 is a sectional view of the embodiment 1 of the present invention.
Figure 2:
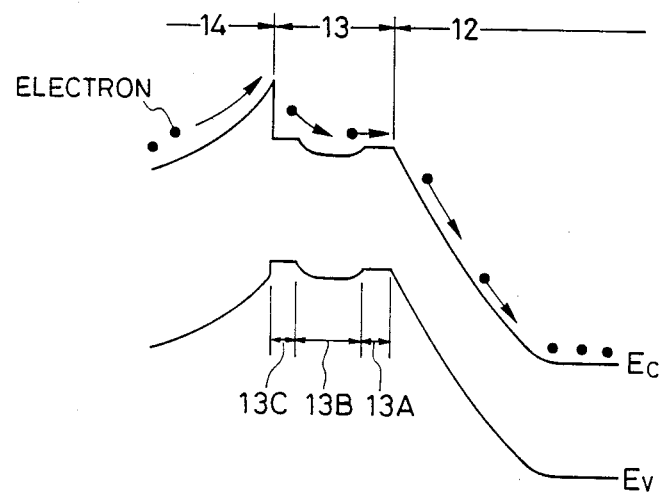
FIG. 2 shows the energy band diagram of the embodiment 1.

FIG. 1 is a sectional view of an npn heterojunction bipolar transistor according to the embodiment 1 of the present invention, while FIG. 2 shows the energy band diagram of the device.

On an $n^+$-GaAs substrate 10 doped with Si as an n-type dopant (Si concentration: about $2\times 10^{-18}cm^{-3}$), an $n^+$-GaAs layer 11 doped with Si as an n-type dopant (Si concentration: about $5\times 10^{18}cm^{-3}$) and having a thickness of about 5000Å and an n-GaAs layer 12 similarly doped with Si as an n-type dopant (Si concentration: about $1\times 10^{16}cm^{-3}$) and having a thickness of about 3000Å are grown by the MBE method to form a collector layer. Next, a $p^+$-GaAs layer 13A doped with Be (Be concentration: about $1\times 10^{19}cm^{-3}$) and having a thickness of about 200Å , a p-GaAs layer 13B doped with Be (Be concentration: about $1\times 10^{17}cm^{-3}$) and having a thickness of about 600Å and a $p^+$-GaAs layer 13C doped with Be (Be concentration: about $4\times 10^{19}cm^{-3}$) and having a thickness of about 200Å are successively grown to form a base layer 13.

Next, an n-$Ga_{1-x}Al_xAs$ layer 14 doped with Si (Si concentration: about $3\times 10^{17}cm^{-3}$; $x\approx 0.3$) and having a thickness of about 1000Å is grown as an emitter layer. Finally, an $n^+$-GaAs layer 15 doped with Si (Si concentration: about $5\times 10^{18}cm^{-3}$) and having a thickness of about 1000Å is grown in order to obtain an ohmic contact with the electrode.

Subsequently, an emitter electrode 16 made of AuGe and base electrodes 17 made of AuZn are formed by the use of ordinary photolithography and evaporation processes.

FIG. 2 schematically shows the energy band diagram of this embodiment. Electrons which are injected into the base layer 13 from the emitter layer 14 are caused to drift to the intermediate region 13B of the base layer by the built-in field which is formed between the highly doped p+-GaAs layer 13C and the low doped p-GaAs layer 13B, and the electrons are further caused to reach the collector layer 12 through the highly doped p+-GaAs layer 13A by diffusion. Accordingly, the electrons injected into the base layer 13 are prevented by the built-in field from being affected by the surface recombination, and the emitter area dependency of the current gain is reduced.

Embodiment 2

Figure 3:
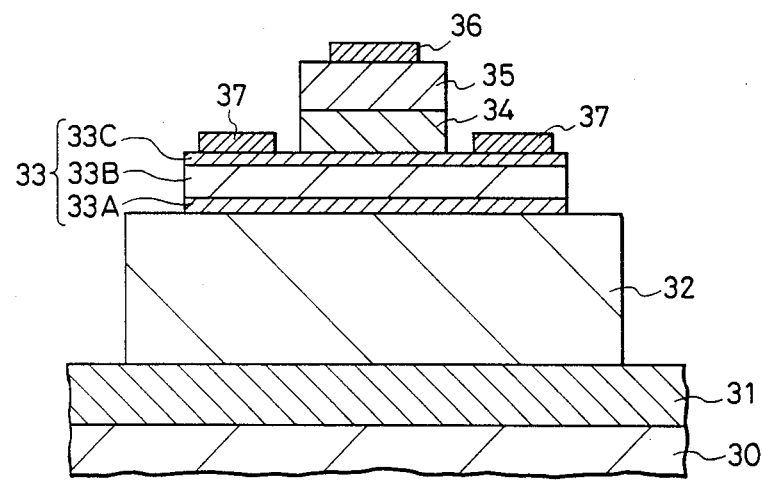
FIG. 3 is a sectional view of the embodiment 2 of the present invention.
Figure 4:
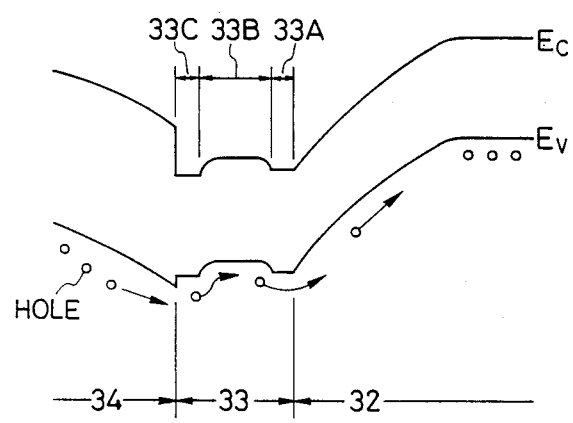
FIG. 4 shows the energy band diagram of the embodiment 2.

FIG. 3 is a sectional view of a pnp heterojunction bipolar transistor according to the embodiment 2 of the present invention, while FIG. 4 shows the energy band diagram of the device.

On a p+-GaAs substrate 30 doped with Ge (Ge concentration: about $2 \times 10^{19} cm^{-3}$), a p+-GaAs layer 31 doped with Be (Be concentration: about $2 \times 10^{19} cm^{-3}$) and having a thickness of about 5000Å and a p-GaAs layer 32 similarly doped with Be (Be concentration: about $1 \times 10^{16} cm^{-3}$) and having a thickness of about 3000Å are grown by the MBE method to form a collector layer.

Next, an n+-GaAs layer 33A doped with Si (Si concentration: about $5 \times 10^{18} cm^{-3}$) and having a thickness of about 200Å, an n-GaAs layer 33B doped with Si (Si concentration: about $1 \times 10^{17} cm^{-3}$) and having a thickness of about 600Å and an n+-GaAs layer 33C doped with Si (Si concentration: about $5 \times 10^{18} cm^{-3}$) and having a thickness of about 200Å are successively grown to form a base layer 33.

Next, a p-Ga$_{1-x}$Al$_x$As layer 34 doped with Be (Be concentration: about $2 \times 10^{17} cm^{-3}$) and having a thickness of about 1000Å is grown as an emitter layer. Finally, a p+-GaAs layer 35 doped with Be (Be concentration: about $2 \times 10^{19} cm^{-3}$) and having a thickness of about 1000Å is grown in order to obtain an ohmic contact.

Subsequently, an emitter electrode 36 made of AuZn and base electrodes 37 made of AuGe are formed by the use of ordinary photolithography and evaporation processes.

FIG. 4 schematically shows the energy band diagram of the above-described pnp type heterojunction bipolar transistor. Holes which are injected into the base layer 33 from the emitter layer 34 are caused to move to the low doped region 33B by the built-in field which is formed between the highly doped region 33C and the low doped region 33B in the base layer, and the holes are further caused to reach the collector layer 32 through the highly doped region 33A by diffusion. Accordingly, the holes which are injected into the base layer do not stay in the vicinity of the emitter-base interface, and therefore it is possible to reduce the effect of the surface recombination.

According to the present invention, a built-in field is provided in the base layer of a hetero-junction bipolar transistor to prevent electrons or holes injected from the emitter from staying in the vicinity of the interface. Therefore, it is possible to improve by a large margin the emitter area dependency of the current gain due to the surface recombination.

What is claimed is:

1. A heterojunction bipolar transistor wherein a base layer of said transistor includes a thin portion in contact with an emitter layer of said transistor said thin portion having a higher impurity concentration than an intermediate portion of said base layer, and wherein said base layer does not contain a heterojunction therein.

2. A heterojunction bipolar transistor according to claim 1, wherein said base layer further includes a second thin portion in contact with a collector layer of said transistor, said second thin portion having a higher impurity concentration than said intermediate portion of said base layer.

3. A heterojunction bipolar transistor comprising:
   a substrate;
   a collector layer formed on said substrate;
   a base layer formed on said collector layer, wherein said base layer does not contain a heterojunction therein;
   an emitter layer formed on said base layer; and
   electrodes for contacting said emitter layer and said base layer;
   wherein said base layer includes a first thin region in contact with said collector layer, and a second thin region in contact with said emitter layer, said first and second thin regions having a higher impurity concentration than an intermediate region of said base layer.

4. A heterojunction bipolar transistor according to claim 3, wherein said collector layer includes a first region in contact with said substrate, and a second region in contact with said base layer, said first region of said collector layer having a higher impurity concentration than said second region of said collector layer.

5. A heterojunction bipolar transistor according to claim 3, further including an ohmic contact layer formed on said emitter layer.

6. A heterojunction bipolar transistor according to claim 3, wherein said heterojunction bipolar transistor is an NPN heterojunction bipolar transistor.

7. A heterojunction bipolar transistor according to claim 3, wherein said heterojunction bipolar transistor is a PNP heterojunction bipolar transistor.

* * * * *